United States Patent [19]

Tabata et al.

[11] Patent Number: 4,642,468
[45] Date of Patent: Feb. 10, 1987

[54] POSITION DETECTING METHOD FOR DETECTING THE RELATIVE POSITIONS OF THE FIRST AND SECOND MEMBERS

[75] Inventors: Mitsuo Tabata; Nobuo Shibuya, both of Yokohama, Japan

[73] Assignee: Kabushiki Kaisha Toshiba, Kawasaki, Japan

[21] Appl. No.: 681,491

[22] Filed: Dec. 13, 1984

[30] Foreign Application Priority Data

Dec. 19, 1983 [JP] Japan ................. 58-239392

[51] Int. Cl.$^4$ ............................. G01N 21/86
[52] U.S. Cl. ......................... 250/548; 250/557
[58] Field of Search ............. 250/548, 201, 204, 557, 250/561

[56] References Cited

U.S. PATENT DOCUMENTS 3,712,740 1/1973 Hennings ............ 250/548

OTHER PUBLICATIONS

Nikon Tech. J., No. 2, 24, 1973, "Photoelectric Microscope", S. Shinoyama.
Servo Technique Manual (First vol.), III-72.

Primary Examiner—Gene Wan
Attorney, Agent, or Firm—Oblon, Fisher, Spivak, McClelland & Maier

[57] ABSTRACT

In a position detecting method, a light beam is radiated onto an object on which a position detecting mark is formed; the reflected beam is detected by a beam detector through a slit; the slit is vibrated, and at the same time a detection signal outputted from the beam detector is detected synchronously with the vibration of the slit; thereby detecting the position of the object. A fundamental wave component $a_f$ and a second harmonic component $a_{2f}$ of the detection signal are fetched due to the synchronous detection and these components $a_f$ and $a_{2f}$ are subjected to the conversions for eliminating the variation in output level in association with the variation in input level while the corresponding relation between the peak point of the fundamental wave component $a_f$ and the zero point of the second harmonic component $a_{2f}$ is held. For example, as these conversions, the following conversions are performed:

$$\begin{cases} a_f{}^* = \dfrac{\alpha \cdot a_f}{\alpha |a_f| + \beta |a_{2f}|} \\ a_{2f}{}^* = \dfrac{\beta \cdot a_{2f}}{\alpha |a_f| + \beta |a_{2f}|} \end{cases}$$

The output components $a_f{}^*$ and $a_{2f}{}^*$ obtained due to these conversions are used as the detection signals, and the position of the object is detected by use of these detection signals $a_f{}^*$ and $a_{2f}{}^*$.

20 Claims, 12 Drawing Figures

POSITION DETECTING METHOD FOR DETECTING THE RELATIVE POSITIONS OF THE FIRST AND SECOND MEMBERS

BACKGROUND OF THE INVENTION

The present invention relates to a method for detecting the position of a predetermined member using a position detecting mark formed on this member.

A position detecting method of the vibration type is used for a photoelectric microscope and has high detection sensitivity; therefore, it is nowadays used as a position detecting method for various kinds of automatic positioning apparatus such as a semiconductor manufacturing apparatus and the like. Such a method is disclosed in, for example, the literature (Nikon Tech. J., No. 2,24, 1973, "About Photo-electric Microscope") (The first volume of Servo Technology Manual <New Technology Development Center> III-72).

The principle of the position detecting method of the vibration type will now be simply described. In this method, a light beam from a beam radiating source is radiated onto an object under examination on which a mark is formed and the reflected light is detected by a detector through a vibrating slit. In this case, since the slit is vibrating, the waveforms of the detection signals differ depending on the relative position between the slit and the mark. A change in signal waveform to the mark position X is as shown in FIG. 12. As will be understood from this diagram, when the mark position coincides with the vibrational central position of the slit, namely, at point (e), the detection signal becomes the signal having a frequency, which is twice the oscillation frequency (fundamental frequency) of the slit, and the fundamental frequency component becomes zero. Therefore, only the fundamental frequency component is obtained from the detection signal by way of synchronous detection, thereby removing the component having a frequency which is twice the fundamental frequency.

The state of change of the fundamental frequency component to the mark position in this case is shown as an output characteristic curve. This output characteristic curve is suitable for use in the detection of the position by means of a zero-meter, and the driving of a servo system because the output becomes zero at the point where the mark position coincides with the vibrational center of the slit and the signs before and behind that point are opposite.

On the other hand, the shape of the above output characteristics curve varies depending on the position detecting conditions such as the mark width, slit width, contrast, scanning (oscillating) amplitude, brightness of illumination, etc., so that the relation between the detected value and the mark position is not made constant. Therefore, in order to always obtain correct position information, it is necessary to perform the calibration every time. If calibration is not performed every time, position setting will become inaccurate and it will take a very long time to detect the position. For instance, the case will be considered where this position detecting method is applied to the detection of position prior to exposure by a light exposing apparatus for use in a process for manufacturing semiconductors. Since the exposure is repeatedly performed before and after a number of various kinds of processing steps in the semiconductor manufacturing process, the contrast of the mark for detection of the position differs every time due to the difference in steps and the difference in resist conditions and the like, so that the peak value and gradient of the output characteristic curve of the photoelectric microscope of the vibration type will be different each time. Due to this, a method has also been considered whereby the information regarding the contrast of a mark depending upon the difference in steps is preliminarily stored in a computer and the output is corrected on the basis of this information. However, in this method, it is impossible to correct with high accuracy since the contrast information of a mark is based on the presumption. Further, since this output also becomes unstable due to variation in illuminance, when sufficient stability of illuminance cannot be obtained, the peak value and gradient of the output characteristic curve also change with the lapse of time. In addition, recently, it is possible to perform the alignment using the principle of this position detection for an electron beam transfer printing apparatus which is considered to be promising for the transfer printing of fine patterns in the submicron order. However, a similar problem is also caused in this case. Moreover, in this case, although an electron beam is radiated onto a mark in place of radiating the light beam thereon, there is the phenomenon of a photoelectric surface, which serves as a source for generating this electron beam, and which deteriorates with the elapse of time, causing the quantity of radiation of the electron beam to change as the time passes. Thus, the time change also appears in the output signal. Since such time changes are difficult to forecast, it is actually difficult to correct the output on the basis of the above presumption with high accuracy.

For these reasons, it is necessary to set the gradient of the output characteristic curve to always be constant by means of the AGC (auto gain control) of the signal. It is simple for the AGC to control the gain so that the peak voltage of the output characteristic curve becomes a constant value by always making a mark for detection of the position approaching the beam from a fixed direction. However, in this method, it is necessary to perform the detection while the mark is being scanned for a certain time interval, so that it takes a long time to detect the position, reducing the throughput of the apparatus. Moreover, this method cannot cope with the time change of the signal during the time period when the peak value of the output curve is detected and it is difficult to perform the precise positioning within a short time.

On the other hand, as a method by which AGC is performed in real time, a method has been considered whereby the effective value or peak value of the signal is detected and the gain is controlled so that the value is always constant. However, the detection signal obtained by the vibration type position detecting system has a complicated signal waveform because it includes the high frequency components as well as the fundamental frequency component, and their output components largely differ in their dependence upon the mark positions, and the like. Consequently, in the conventional method, it is difficult to perform AGC with a high degree of accuracy without using position information.

SUMMARY OF THE INVENTION

It is an object of the present invention to provide a position detecting method of the vibration type in which an output level of a position detection signal is constant even when the position detecting condition changes.

Another object of the invention is to provide a position detecting method of the vibration type which can detect the position without causing an increase in detection time and a decrease in detection accuracy.

According to the present invention, a beam, obtained from a first mark portion formed on a first member by radiation of a beam from a beam radiating source, is radiated onto a second member having a second mark portion. The beam obtained from the second member is detected by a beam detector. At the same time, the above-mentioned beam and the first or second member are relatively vibrated and a detection output of the beam detector is detected synchronously with this vibration. With respect to each signal of the fundamental wave component $a_f$ and the n-th order harmonic component $a_{nf}$ (n is an integer of 2 or more) of the output obtained by synchronous detection, each signal is function-converted under the condition that a predetermined corresponding relation between these signals is held. The relative positions of the first and second members are detected by the normalized signals $a_f^*$ and $a_{nf}^*$ obtained by the function conversion. In this case, the first or second mark portion may be a slit or a mark constituted by substance different from the peripheral substance.

DETAILED DESCRIPTION OF THE PREFERRED EMBODIMENTS

The fundamental principle of the present invention will be first explained prior to the explanation of the embodiments.

The concept of the present invention is that, in the position detecting method of the vibration type, the fundamental wave component $a_f$ and the n-th order harmonic component $a_{nf}$ (n is an integer of 2 or more), for example, the second harmonic component $a_{2f}$ which are obtained by synchronously detecting the beam detection output are not directly used as the position detection signals, but the $a_f$ and $a_{2f}$ are subjected to particular function conversion in order to obtain the normalized signals $a_f^*$ and $a_{2f}^*$ which are not influenced by a change in position detecting conditions. These normalized signals $a_f^*$ and $a_{2f}^*$ are used as the position detection signals.

Figure 3:
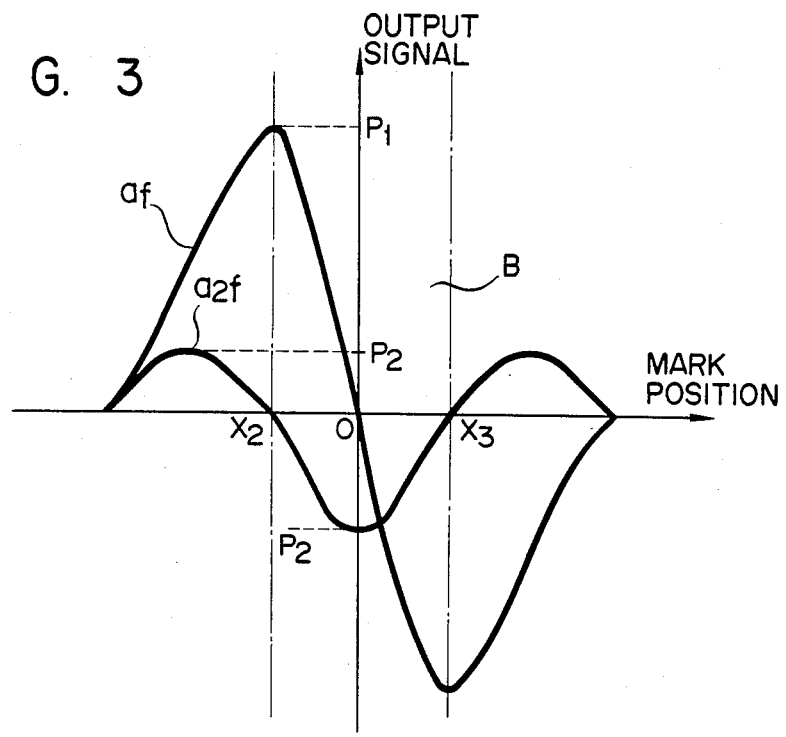
FIG. 3 is a signal waveform diagram showing output characteristic curves of the fundamental frequency component and double frequency component at the mark position.

The relation between the output characteristics of the signals $a_f$ and $a_{2f}$ obtained by the above-mentioned synchronous detection is as shown in FIG. 3. Namely, the $a_f$ indicates zero at the point where the mark position is zero (coincides with the oscillation center), $a_{2f}$ represents the peak value, and $a_{2f}$ shows zero at the position where the $a_f$ indicates the peak value. The curve between two peak values of the $a_f$ is monotonous. These relations are peculiar to the position detection of this kind. If the combination of the output characteristics of $a_f^*$ and $a_{2f}^*$ obtained by performing some conversions for the $a_f$ and $a_{2f}$ satisfies the similar relations, the $a_f^*$ and $a_{2f}^*$ can be also used as the position detection signals.

The present inventors have done much research paying attention to this point and, consequently, have found that there exist conversion functions such that even when the position detecting conditions change, the $a_f^*$ and $a_{2f}^*$ which satisfy the above-mentioned relation are not affected by such changes. One example among such conversion functions is $$a_f^* = K_1 \cdot \frac{\alpha_1 \cdot a_f}{\alpha_1 |a_f| + \beta_1 |a_{2f}|}$$

$$a_{2f}^* = K_2 \cdot \frac{\beta_2 \cdot a_{2f}}{\alpha_2 |a_f| + \beta_2 |a_{2f}|}$$

where, $\alpha_1$, $\beta_1$, $\alpha_2$, $\beta_2$, $K_1$, and $K_2$ are arbitrary constants. Use of these normalized signals $a_f^*$ and $a_{2f}^*$ as the position detection signals allows the above-mentioned relations regarding the characteristic curves to be held and makes it possible to perform position detection, which has the effect of automatic gain control for the variation in input signal level.

The present invention will now be described in detail with respect to embodiments shown in the diagrams.

Figure 1:
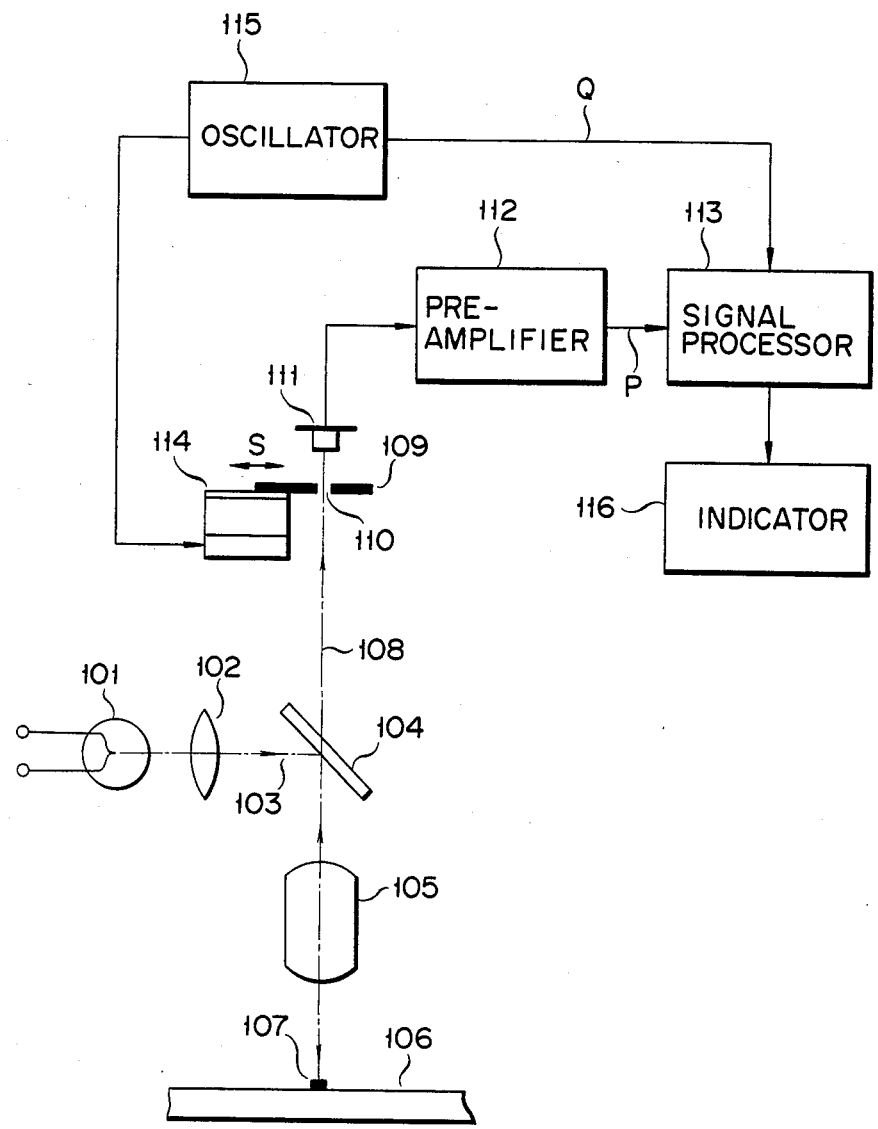
FIG. 1 is a schematic arrangement diagram showing a position detecting apparatus of the vibration type used in a method of detecting a position according to a first embodiment of the present invention.

FIG. 1 is a schematic arrangement diagram showing a position detecting apparatus of the vibration type used in a method of a first embodiment of the invention. A light beam 103 radiated from a beam radiating source, consisting of a light source 101 and a focusing lens 102, and the like, is radiated onto an object under examination (first member) 106 through a half mirror 104 and an objective lens 105. For instance, a recilinear positioning mark (first mark portion) 107 is formed on the object 106 under examination and the light beam 103 is radiated near the mark 107. The mark 107 is formed of a member having a reflectance larger than that of the object under examination. A reflected light 108 from the mark 107 due to the irradiation of the light beam progresses upwardly through the objective lens 105 and half mirror 104 and passes through a slit (second mark portion) 110 of a slit plate (second member) 109 and is received by a photoelectric converter (beam detector) 111. A detection signal P outputted from the photoelectric converter 111 is supplied through a preamplifier 112 to a signal processor 113, which will be mentioned later.

On the other hand, the slit plate 109 is attached to a vibrator 114 and the slit 110 is vibrated in the direction (indicated by an arrow S in the diagram) perpendicular to the progressing direction of the relfected light 108. Namely, the vibrator 114 vibrates in accordance with an oscillation output Q of an oscillator 115, thereby causing the quantity of light transmitted through the slit 110 of the slit plate 109 to be changed in response to the vibration. The vibrator 114 is formed by, e.g., a piezoelectric element which expands and contracts in response to the applied voltage. The oscillation output Q of the oscillator 115 is also supplied to the vibrator 114 and signal processor 113. The signal processor 113 detects (rectifies) the detection signal P inputted in the manner as will be explained later synchronously with the oscillation output Q of the oscillator 115 and performs a desired signal conversion, which will be explained later, and supplies the converted output to an indicator 116.

Figure 2:
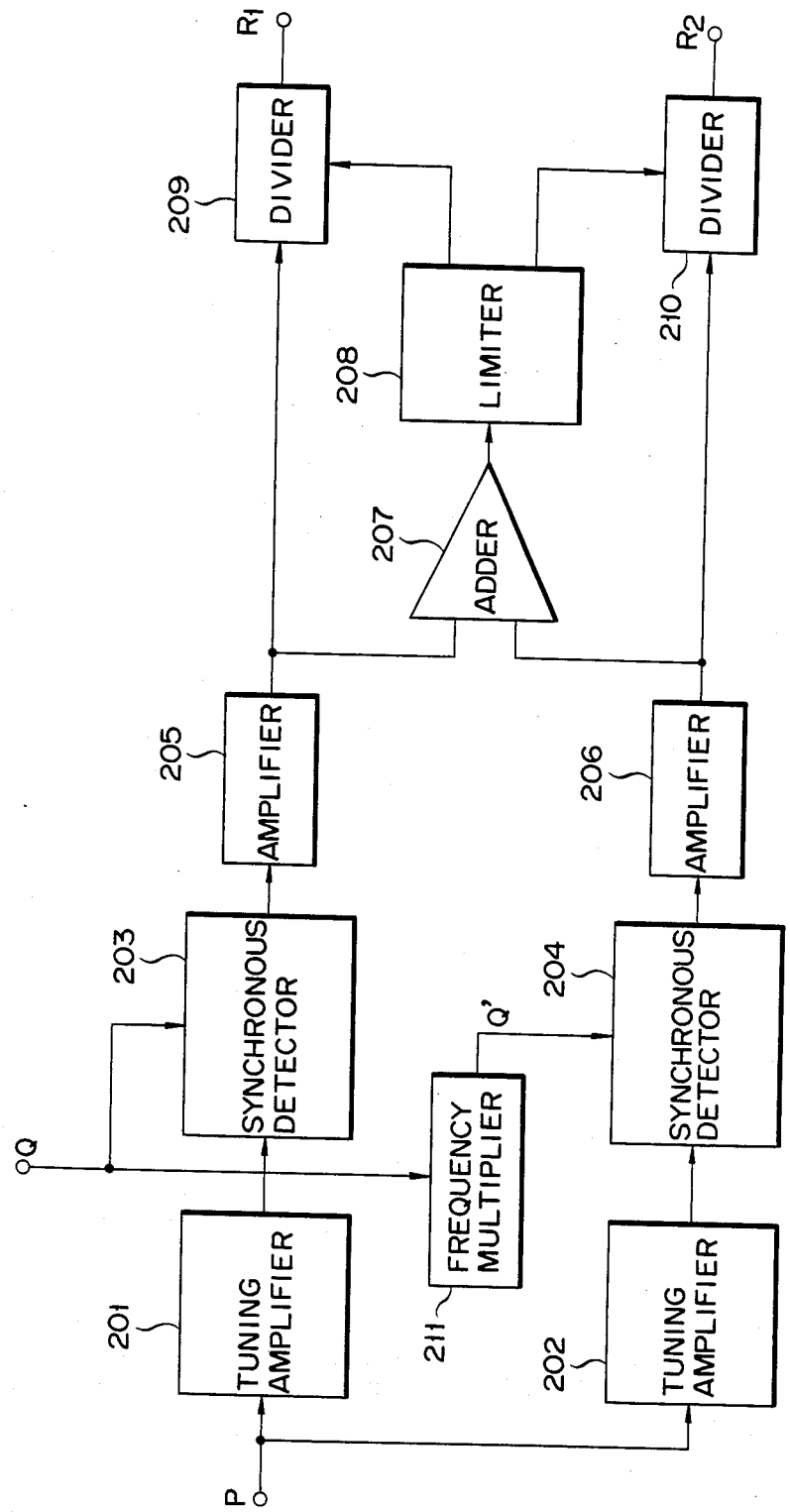
FIG. 2 is a block diagram showing a practical arrangement of a signal processing section as the main part of the above apparatus.

As shown in FIG. 2, the signal processor 113 comprises: tuning amplifiers 201 and 202; synchronous detectors 203 and 204; amplifiers 205 and 206; an adder 207; a limiter 208; deviders 209 and 210; and a frequency multiplier 211. Namely, the detection signal P inputted through the preamplifier 112 is respectively supplied to the two tuning amplifiers 201 and 202 having the different tuning frequencies f and 2f. The amplified outputs from the respective amplifiers 201 and 202 are respectively supplied to the synchronous detectors 203 and 204. The oscillation output Q (frequency f) from the oscillator 115 is supplied to the synchronous detector 203, while an output O′ (frequency 2f) of which the output Q was doubled by the frequency multiplier 211 is supplied to the synchronous detector 204. Each of the amplification signals is synchronization-detected synchronously with the oscillation outputs Q and Q′ by the synchronous detectors 203 and 204. Thus, the fundamental wave component $a_f$ of the detection output is outputted from the synchronous detector 203, while the second harmonic component $a_{2f}$ is outputted from the synchronous detector 204. These two detection outputs $a_f$ and $a_{2f}$ are respectively amplified by the amplifiers 205 and 206 and become $\alpha|a_f|$ and $\beta|a_{2f}|$ and are inputted to the adder 207. The output $\alpha|a_f|+\beta|a_{2f}|$ from the adder 207 is supplied through the limiter 208 to the dividers 209 and 210. Then, $R_1 = \alpha \cdot a_f/(\alpha|a_f| + \beta|a_{2f}|)$ $R_2 = \beta \cdot a_{2f}/(\alpha|a_f| + \beta|a_{2f}|)$ are respectively outputted from the dividers 209 and 210. These outputs are supplied as the new position detection signals $R_1$ and $R_2$ to the indicator 116. $\alpha$ and $\beta$ indicate arbitrary constants, respectively.

Next, the position detecting method using the above-described apparatus will be explained.

The fundamental principle of the position detecting method of the vibration type is similar to a conventional one. First, by turning on the light source 101, a light beam is radiated onto the mark 107 on the object 106 under examination. The reflected light from the mark 107 is detected through the slit plate 109 by the photoelectric converter 111. At the same time, the slit plate 109 is vibrated, thereby causing the light quantity of the reflected light 108 from the mark 107 which is received by the photoelectric converter 111 to be changed in response to the vibration. By synchronously detecting the detection output P, the fundamental wave component $a_f$ and the second harmonic component $a_{2f}$ are obtained.

The above steps are similar to those of the conventional method, while in the method of the present embodiment, those components are subjected to the following conversions by the signal processor 113. In other words, according to the method of this embodiment, attention is paid to the fact that the outputs $a_f$ and $a_{2f}$ after the synchronous detection have certain peculiar relations regarding the position, as will be explained later. The arithmetic operations are performed using these two outputs as they are and the following conversions are executed.

$$\left. \begin{array}{l} a_f^* \rightarrow \dfrac{\alpha \cdot a_f}{\alpha|a_f| + \beta|a_{2f}|} \equiv a_f^* \\[6pt] a_{2f}^* \rightarrow \dfrac{\beta \cdot a_{2f}}{\alpha|a_f| + \beta|a_{2f}|} \equiv a_{2f}^* \end{array} \right\} \quad (1)$$

The outputs $a_f^*$ and $a_{2f}^*$ after these conversions are used as the new position detection signals $R_1$ and $R_2$.

The relations regarding the positions of the $a_f$, $a_{2f}$, and $a_f^*$, $a_{2f}^*$ will now be described. FIG. 3 shows typical output characteristic curves of the $a_f$ and $a_{2f}$. The relations of the $a_f$ and $a_{2f}$ are such that the $a_f$ becomes zero and $a_{2f}$ indicates a peak value $P_2$ when the positional deviation amount between the mark 107 and the slit 110 is zero, while the $a_{2f}$ represents zero at the point where the $a_f$ indicates a peak value $P_1$. As will be mentioned later, even when the input signal level changes due to the change in contrast of the mark, the above relations are always satisfied and the ratio between the $a_f$ and $a_{2f}$ at the same mark position is always constant.

Figure 4:
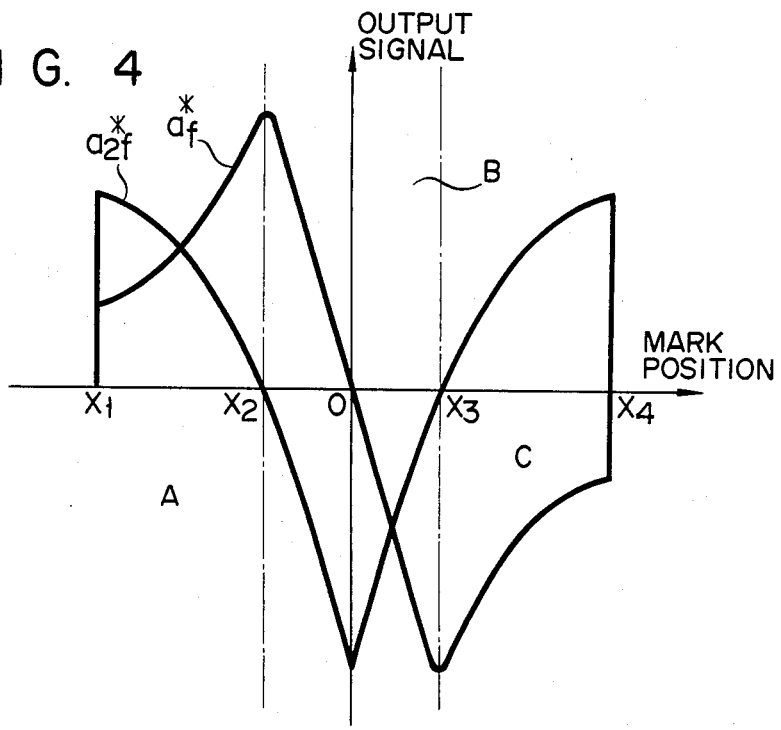
FIG. 4 is a signal waveform diagram showing output characteristic curves of the fundamental frequency component and double frequency component at the mark position after the function conversions.

On the other hand, the positioning is ordinarily performed in a manner such that the position is corrected and the position detection output $a_f$ becomes zero. However, as a position detection curve it is not always limited to the curve of $a_f$ as it is, but it is possible to use, as the position detection curve, a curve such that the output indicates zero at the point where the positional deviation amount is zero, and that becomes monotonous in the region B where the position coordinates of the mark 107 lie between $X_2$ and $X_3$. Therefore, in consideration of the relations of the $a_f$ and $a_{2f}$ mentioned above, values of $\alpha$ and $\beta$ are selected so as to satisfy a constant relation, for instance, a relation of $\alpha:\beta = |P_2|:|P_1|$. At this time, $|P_2|/|P_1|$ is constant and is a known amount if the width of mark and scanning amplitude are the same. The output characteristics of the $a_f^*$ and $a_{2f}^*$ obtained by performing the conversions of the above expressions (1) using $\alpha$ and $\beta$ which were determined in this way are as shown in FIG. 4. As for $a_f^*$, the curve is such that the output becomes zero at the point where the positional deviation is zero and that it becomes monotonous in the region B where the positional coordinates lie between $X_2$ and $X_3$. Namely, the positioning can be performed by use of the $a_f^*$ as the position detection curve. In addition, the positions in regions A and C which are located in the outside of the region B can be also detected by using both $a_f^*$ and $a_{2f}^*$.

Next, it will be described why the $a_f^*$ and $a_{2f}^*$ never change with respect to the variation in input signal level (the AGC functions). Since it can be considered that the outputs $a_f$ and $a_{2f}$ change in proportion to the change of the input signal level, when a case where the following changes occur provisionally is considered, $$a_f \rightarrow K \cdot a_f$$

$$a_{2f} \rightarrow K \cdot a_{2f} (K > 0)$$

we will have $$a_f^* \rightarrow \frac{\alpha \cdot K|a_f|}{\alpha \cdot K|a_f| + \beta \cdot K|a_{2f}|}$$

$$= \frac{\alpha|a_f|}{\alpha|a_f| + \beta|a_{2f}|} = a_f^*$$

$$a_{2f}^* \rightarrow \frac{\beta \cdot K|a_{2f}|}{\alpha \cdot K|a_f| + \beta \cdot K|a_{2f}|}$$

$$= \frac{\beta|a_{2f}|}{\alpha|a_f| + \beta|a_{2f}|} = a_{2f}^*$$

From expressions (1). Thus, it will be understood that the $a_f^*$ and $a_{2f}^*$ do not change depending on the value of K. Therefore, by using the output characteristic curve of $a_f^*$ for the position detection, it is possible to obtain a stable position detection signal having the effect of AGC for the variation in input signal level.

As described above, according to this embodiment, it is possible to perform the position detection of the oscillatory type having the effect of AGC for the change of the input signal level without losing the detection accuracy. In addition, since the effect of AGC can be obtained by performing the arithmetic operation processing of the output after the synchronous detection, this makes it possible to carry out AGC with high accuracy and with little effect from the noise component of the input signal. Therefore, the position detection having the effect of AGC can be performed even for the change in input signal level due to the change in contrast of the mark on a wafer, which is used, in particular, in a semiconductor manufacturing apparatus and due to the time-change of a source for generating a mark signal, thereby enabling the position detection and positioning to be performed with high accuracy. In addition, since there is no need to carry out additional detection for sensing the change in input signal level, the time necessary for the positioning can be shortened, so that there is also an advantage such as an improvement in throughput.

Figure 5:
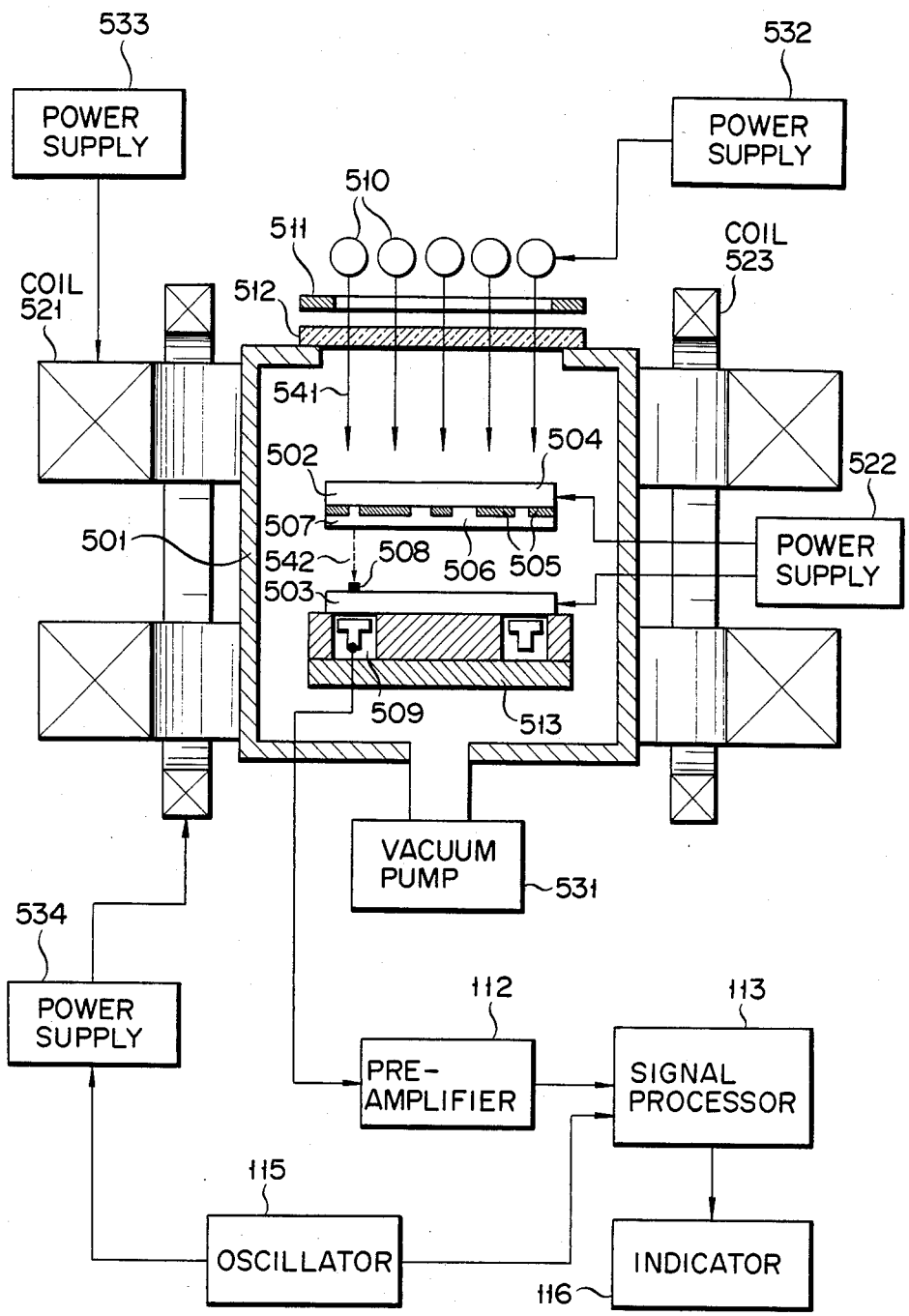
FIG. 5 is a schematic arrangement diagram for explaining a method according to a second embodiment of the invention, showing an electron beam transfer printing apparatus of the photoelectric surface masking type and a position detecting mechanism.

FIG. 5 is a schematic diagram for explaining a method according to a second embodiment of the present invention, showing an electron beam transfer printing apparatus of the photoelectric surface mask type and a detecting mechanism for detection of the position. In the diagram, the same parts and components as those shown in FIG. 1 are designated by the same reference numeral and their detailed descriptions are omitted.

The arrangement of the electron beam transfer printing apparatus itself is similar to a well-known apparatus, so that it will be briefly explained. Namely, a photoelectric mask (first member) 502 and a sample (second member) 503 are vertically arranged so as to face one another in a vacuum vessel 501. The photoelectric mask 502 comprises: a glass substrate 504 which transmits the ultraviolet rays; a mask pattern 505 consisting of a member (e.g., chromium) which intercepts the ultraviolet rays; and a photoelectric surface 506 consisting of a member (e.g., CsI) which emits an electron beam due to the irradiation of ultraviolet rays. Also, a positioning mark (first mark portion) 507 for positioning with the sample 503 is formed on the photoelectric mask 502. The sample 503 is placed on a table 513 and can be moved to the right and left on the paper and in the direction perpendicular thereto. A positioning mark (second mark portion) 508 is formed on the sample 503 at the position corresponding to the mark 507 on the photoelectric mask 502. The X rays are radiated onto the mark 508 due to the irradiation of electron beam. The X rays emitted from the mark 508 are detected by an X-ray detector (beam detector) 509.

On the other hand, a light source 510 for generating the ultraviolet rays is arranged above the vessel 501. The ultraviolet rays radiated from the light source 510 are radiated onto the photoelectric mask 502 through a shutter 511 and a window 512 which transmits the ultraviolet rays. In addition, a focusing coil 521 is disposed on the outside of the vessel 501. The focused magnetic field is applied by the coil 521 in the direction (vertical direction on the paper) where the mask 502 and sample 503 face. A DC high voltage power supply 522 is connected between the photoelectric mask 502 and the sample 503. Owing to this power supply 522, an electric field is applied between the mask and the sample in the same direction as the magnetic field applying direction. On one hand, a beam deflecting coil 523 is arranged on the outside of the vessel 501. The electron beam radiated from the photoelectric mask 502 is deflected by the coil 523 to the right and left on the paper and in the direction perpendicular thereto.

In the diagram, reference numeral 531 denotes a vacuum pump for vacuum exhausting the air in the vacuum vessel 501; 532 is a lighting power supply for driving the light source 510; 533 is an exciting power supply for driving the focusing coil 521; and 534 is a exciting power supply for driving the deflecting coil 523, respectively.

In this embodiment, the above-mentioned preamplifier 112, signal processor 113, oscillator 115, and indicator 116, etc. are connected to the transfer printing apparatus with such an arrangement as mentioned above. Namely, the detection output of the X-ray detector 509 is supplied to the preamplifier 112 and an output of the preamplifier 112 is supplied to the signal processor 113. In addition, the oscillation output of the oscillator 115 is supplied to the signal processor 113 and power supply 534. Due to this, the current which is supplied to the deflecting coil 523 is modulated and the electron beam emitted from the photoelectric mask 504 is deflected.

The X-ray detector 509 corresponds to the photoelectric converter 111; the photoelectric mask 502 corresponds to the object 106 under examination; the sample 503 corresponds to the slit 109; and the power supply 534 and the coil 523 correspond to the vibrator 114.

Next, the method of positioning between the photoelectric mask 502 and the sample 503 will be explained.

Fist, when the light source 510 is driven, ultraviolet rays 541 emitted from the light source 510 are radiated onto the photoelectric mask 502 through the shutter 511. At this time, the ultraviolet rays 541 are radiated to only the portion near the mark 507 on the photoelectric mask 502 by use of the shutter 511. Photoelectrons (electron beam) 542 are emitted from the mark 507 on the photoelectric mask 502 due to the irradiation of the ultraviolet rays 541. The electron beam 542 progresses downward due to the focused magnetic field and electric field and is radiated onto the sample 503. At the same time, the coil 523 is driven in response to a signal outputted from the oscillator 115, so that the electric beam 542 is deflected (vibrated). In this case, the electron beam 542 and the beam detector 509 relatively vibrate in a manner similar to which the slit plate 109 is vibrated, thereby allowing the mark 508 to be scanned by the electron beam 542.

The detection signal from the X-ray detector 509 is supplied to the signal processor 113 through the preamplifier 112. In the signal processor 113, the detection signal outputted from the X-ray detector 509 is detected synchronously with an oscillation signal from the oscillator 115 similarly to the foregoing embodiment. Namely, the detection signal of the X-ray detector 509 is synchronously detected.

The fundamental wave component $a_f$ and the second harmonic component $a_{2f}$ obtained due to the synchronous detection are function-converted on the basis of the above expressions (1) in a similar manner as the foregoing embodiment. The relative positional deviation between the photoelectric mask 502 and the sample 503 is detected by the signals $a_f^*$ and $a_{2f}^*$ obtained by being function-converted. The positions of the photoelectric mask 502 and sample 503 are relatively positioned by, for instance, slightly moving the sample 503 in response to this positional deviation. For the above positioning, the deflecting position of the beam by the deflecting coil 523 may be constantly held in place by shifting the position of the sample 503.

In this way, according to the method of this embodiment, the position detection of the vibration type having the AGC effect can be performed for the change in input signal level without losing the detection accuracy. Thus, a similar effect as in the method of the previous first embodiment is obtained.

Figure 6:
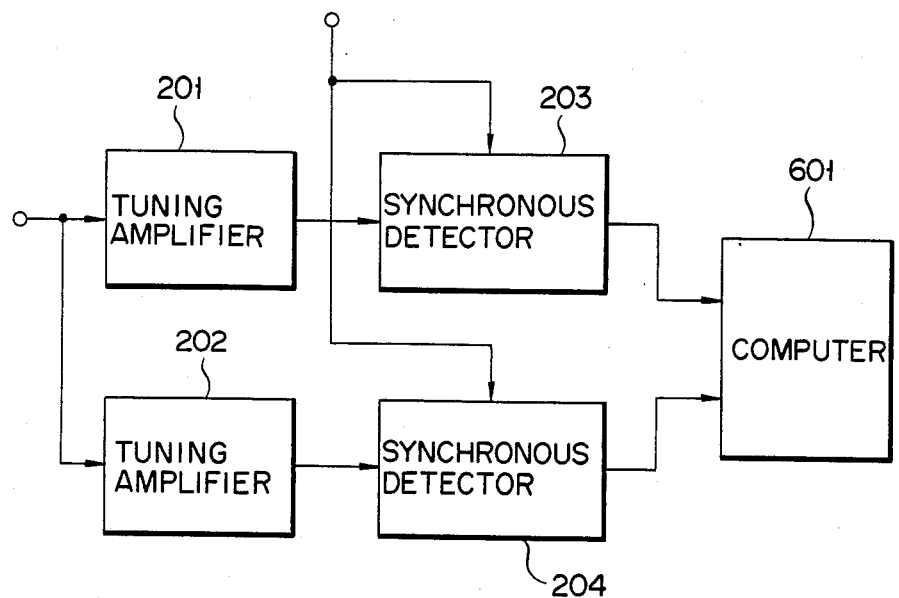
FIG. 6 is a block diagram for explaining a third embodiment of the invention, showing a circuit for performing the signal processing by the digital arithmetic operation.

FIG. 6 is a block diagram for explaining a method of a third embodiment, showing a circuit for performing the above-mentioned signal processing by a digital arithmetic operation. In addition, the same parts and components as those shown in FIG. 2 are designated by the same reference numerals and their detailed descriptions are omitted. A different point of the method of this embodiment from the method of the first embodiment described already is that the AGC is executed by the arithmetic operation processing by a digital computer in place of the AGC processing of the analog signal. Namely, in the signal processor 113, the respective detection output af and a2f of the synchronous detectors 203 and 204 are supplied to a digital computer 601.

In the digital computer 601, by performing the operations such as $$a_f^* = \frac{\alpha \cdot a_f}{\alpha |a_f| + \beta |a_{2f}|} \\ a_{2f}^* = \frac{\beta \cdot a_{2f}}{\alpha |a_f| + \beta |a_{2f}|}$$ (2)

$a_f^*$ and $a_{2f}^*$ are obtained. Therefore, by using the output characteristic curve of $a_f^*$ for the position detection it is possible to perform position detection having a similar AGC effect as the foregoing first embodiment. When performing digital arithmetic operation processing, there are features such that the burden to the hardware of the processor is lightened, as compared with analog processing, but the essential concepts regarding the AGC are identical.

Figure 7:
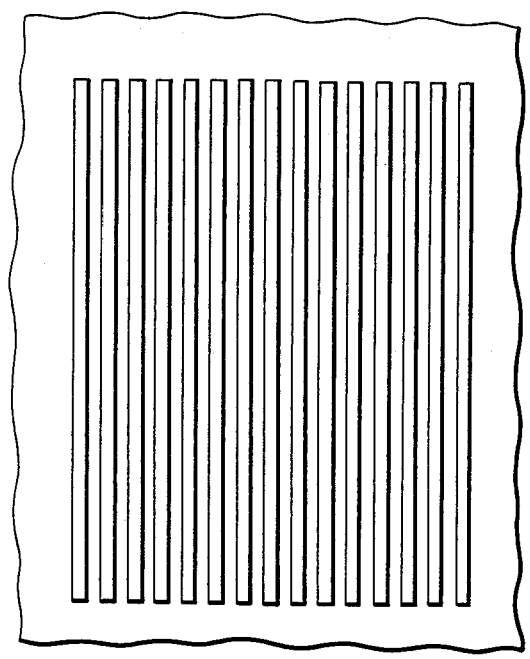
FIG. 7 is a plan view showing a pattern shape of an alignment mark consisting of a pattern of a plurality of lines and spaces.
Figure 8:
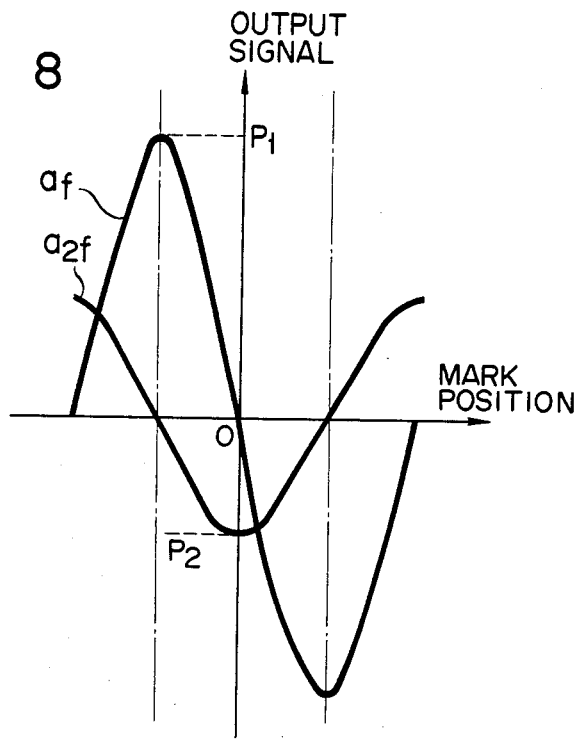
FIG. 8 is a signal waveform diagram showing output characteristic curves of the fundamental frequency component and double frequency component at the mark position when using the mark shown in FIG. 7.
Figure 9:
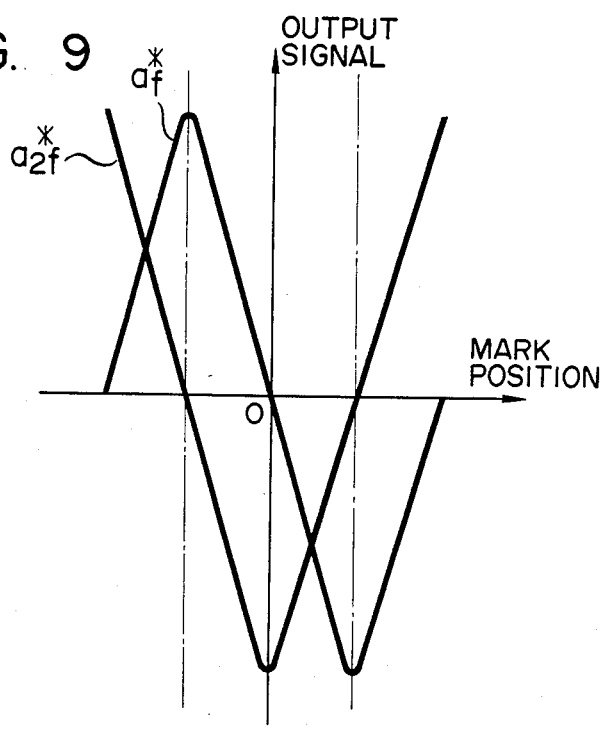
FIG. 9 is a signal waveform diagram showing output characteristic curves of the fundamental frequency component and double frequency component at the mark position after the function conversion when using the mark shown in FIG. 7.

The present invention is not limited to the above-described embodiments. In the foregoing embodiments, description has been made with respect to the case of one line which is ordinarily used as the pattern shape of the mark. However, this mark pattern shape may be a shape consisting of a plurality of lines and spaces as shown in FIG. 7 which are used as the positioning mark in the electron beam transfer printing. The output characteristic curves of $a_f$ and $a_{2f}$ in this case are as shown in FIG. 8. The output characteristic curves of $a_f^*$ and $a_{2f}^*$ obtained by performing the conversions are as shown in FIG. 9. As can be seen from these diagrams, in the case of this example also, the output characteristics of $a_f^*$ and $a_{2f}^*$ having the same tendencies as in the case of the foregoing embodiments are derived, so that it will be appreciated that position detection having a similar effect as with the foregoing embodiments can be carried out. Namely, the position detecting method of the invention can be applied to any mark pattern shapes which are used for the ordinary position detection. In addition, although the function conversions are carried out using the fundamental frequency component $a_f$ and second harmonic component $a_{2f}$ in the embodiments, since the odd-number order harmonic component $a_{(2n+1)f}$ and even-number order harmonic component $a_{2nf}$ respectively have similar characteristics as the $a_f$ and $a_{2f}$, even when the function conversions using the $a_{(2n+1)f}$ and $a_{2nf}$ in place of the $a_f$ and $a_{2f}$ are performed, a similar effect can be obtained.

Figure 10:
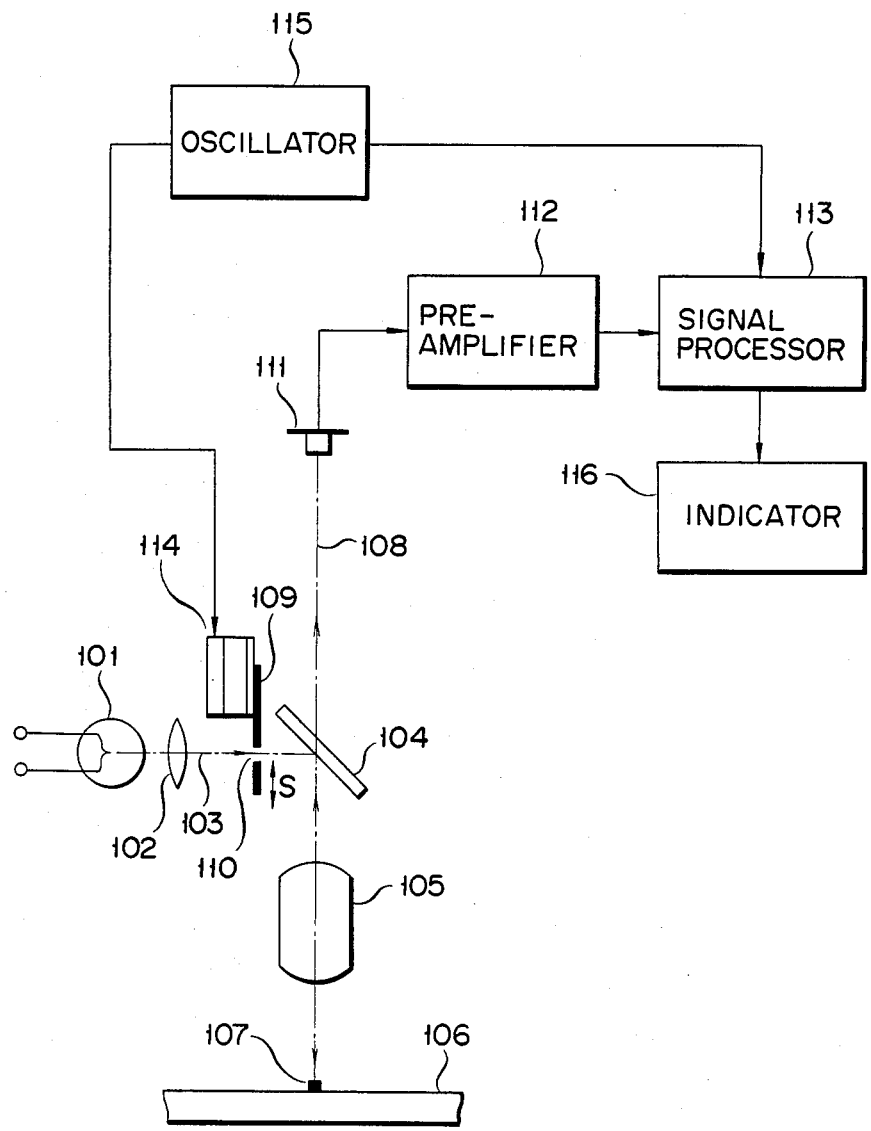
FIG. 10 is a schematic diagram for explaining a modified form of the method of the first embodiment of the invention, showing a position detecting apparatus of the vibration type whereby a slit is arranged on the side of the light incidence.
Figure 11:
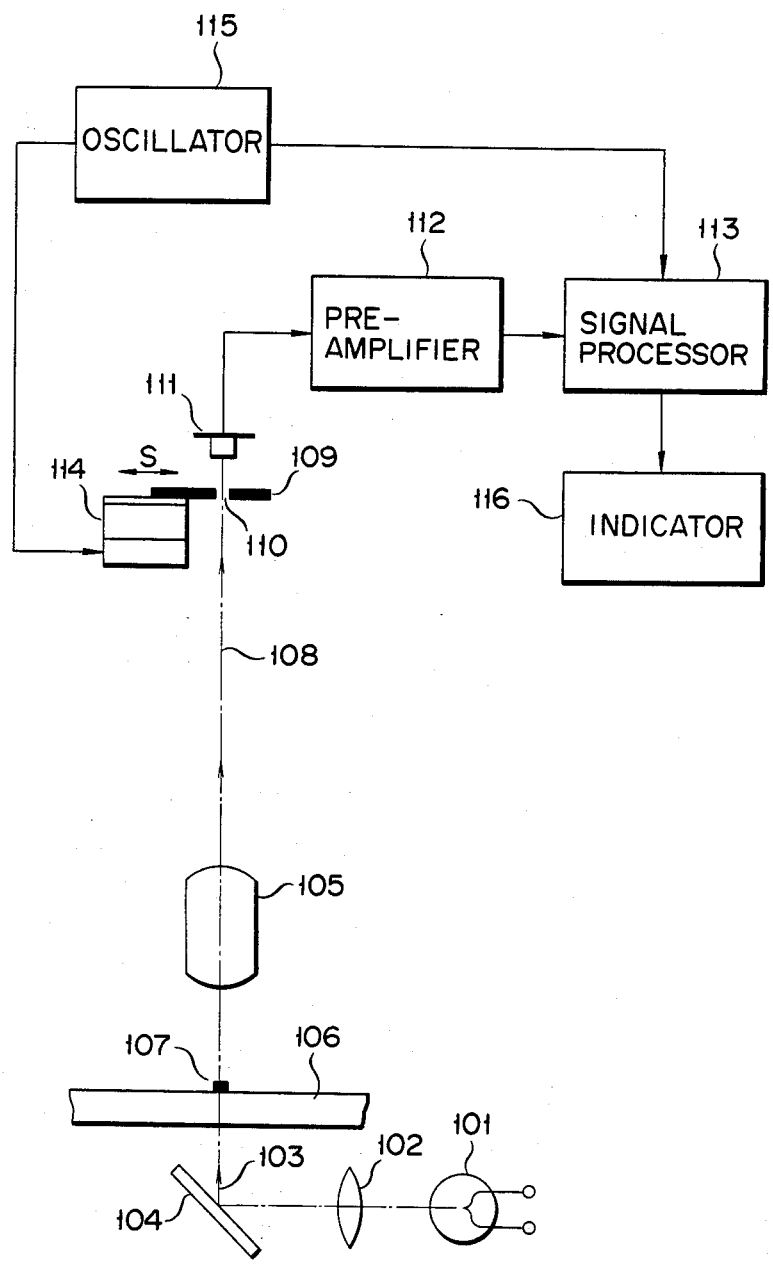
FIG. 11 is a schematic diagram for explaining another modified form of the method of the first embodiment of the invention, showing a position detecting apparatus of the vibration type for detecting a transmitted beam.
Figure 12:
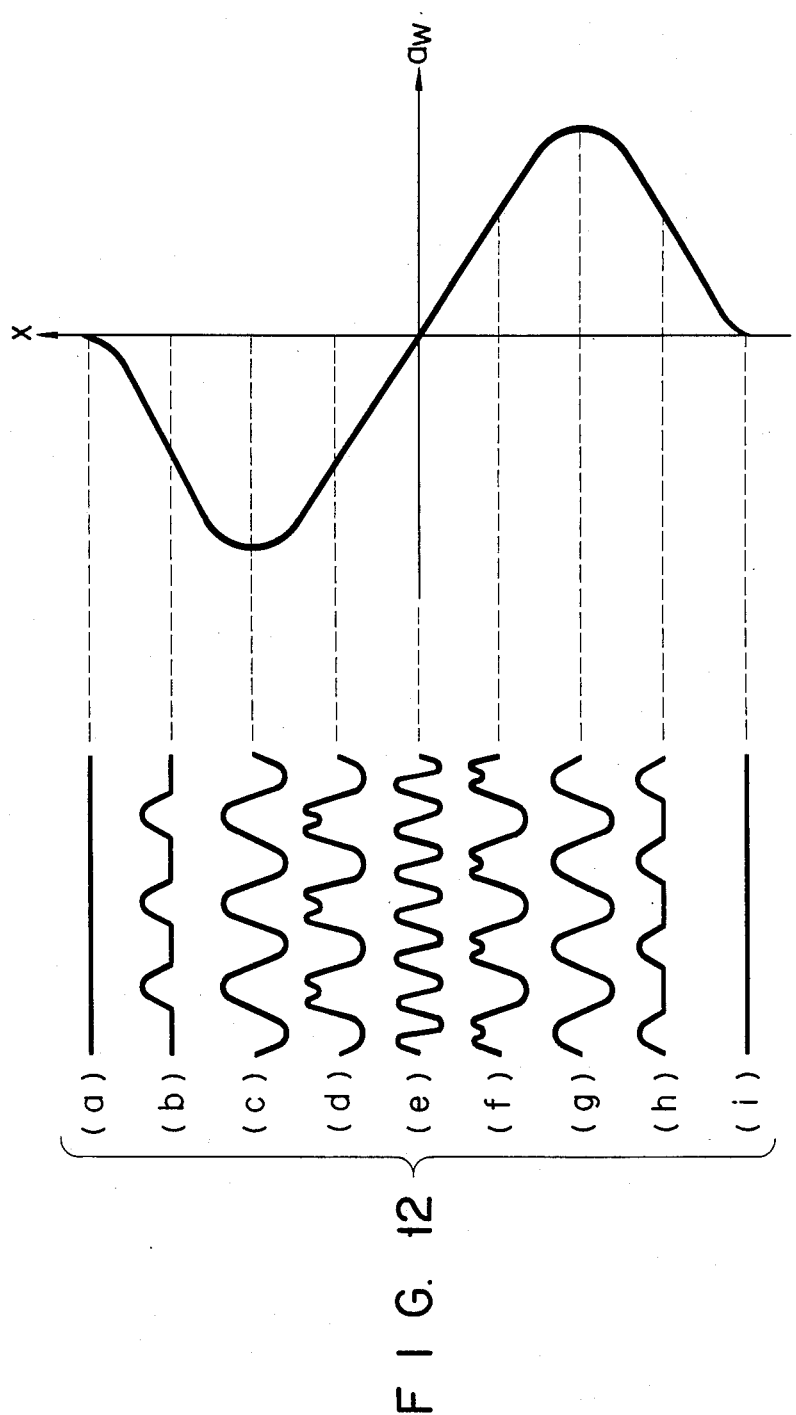
FIG. 12 is a diagram explaining the fundamental principle of the position detecting method of the vibration type, showing the change in detection signal waveform at the mark position X.

On the other hand, in the foregoing first embodiment, as shown in FIG. 10, the slit plate 109, which is vibrated for the light beam 103, may be provided on the side of the light incidence, namely, it may be arranged between the beam radiating source 101 and the mark 107. In such a case, the slit plate 109 corresponds to the first member and the object 106 under examination corresponds to the second number. Further, as shown in FIG. 11, the incident light may be radiated on the back side of the object 106 which should be examined and the transmitted light or a predetermined beam generated by the light irradiation may be detected. When using the mark which radiates the electron beam due to the light irradiation as the mark 107, the detector for detecting the electron beam may be used as the beam detector 111. In addition, the beam radiating source may be the source which radiates the electron beam in place of the light. In this case, the means for vibrating the beam may be the means for deflecting the electron beam. Further, reflected electron, secondary electron, or X rays, etc. may be employed as the detecting beam.

In addition, it is also possible to arbitrarily change the constants in the conversions when they are actually used, and to set them to values which can be easily used. It is intended that the above and other such changes and modifications shall fall within the scope of the invention as defined in the appended claims.

What is claimed is:

1. A position detecting method for detecting relative positions of a first member and a second member, comprising the steps of:
    radiating a first beam radiated from a beam radiating source onto a first member where a first mark portion is formed;
    radiating a second beam obtained from said first mark portion due to the beam irradiation onto a second member where a second mark portion is formed;
    detecting by a beam detector, of a beam obtained from said second member by radiating said second beam onto the second member, and relatively vibrating said second beam and said second member, and detecting a detection output from said beam detector synchronously with said vibration, thereby obtaining a fundamental wave component $a_f$ and an n-th order harmonic component $a_{nf}$ (n is an integer of 2 or more) of said detection output;
    performing a function conversion with said fundamental wave component $a_f$ and said n-th order harmonic component $a_{nf}$ used as input signals such that output signals $a_f^*$, $a_{nf}^*$ are free from change in level regardless of change in level of the input signals so as to noralize the input signals $a_f$, $a_{nf}$ and thus, to obtain normalized signals $a_f^*$, $a_{nf}^*$; and
    detecting the relative positions of said first and second members by use of the signals $a_f^*$ and $a_{nf}^*$ obtained by performing said function conversions.

2. A method according to claim 1, wherein
    two synchronous detectors are used to perform said step for obtaining said fundamental wave component $a_f$ and said n-th order harmonic component $a_{nf}$,
    the first synchronous detector synchronously detects the detection output of said beam detector by use of, as a reference signal, a signal having the same frequency as an oscillation frequency f of said second beam and said second member, and
    the second synchronous detector synchronously detects said detection output by use of, as a reference signal, a signal having the frequency which is n times said oscillation frequency f.

3. A method according to claim 2, wherein
    the detection output of said beam detector is amplified by a tuning amplifier having the tuning frequency f prior to the synchronous detection by said first synchronous detector, and
    said detection output is amplified by a tuning amplifier having a tuning frequency nf prior to the synchronous detection by said second synchronous detector.

4. A method according to claim 1, wherein as said step of performing the function conversions,
    the conversions are performed to the fundamental wave component $a_f$ and the second harmonic component $a_{2f}$ of the output obtained due to said synchronous detection while the correspondence relation between the peak point of said fundamental wave component $a_f$ and the zero point of said second harmonic component $a_{2f}$ is held.

5. A method according to claim 4, wherein as said function conversions, the conversions represented by the following expressions are performed:

$$\begin{cases} a_f^* = K_1 \dfrac{\alpha_1 \cdot a_f}{\alpha_1|a_f| + \beta_1|a_{2f}|} \\ a_{2f}^* = K_2 \dfrac{\beta_2\, a_{2f}}{\alpha_2|a_f| + \beta_2|a_{2f}|} \end{cases}$$

where $\alpha_1$, $\beta_1$ are constants for weighing $a_f$, $a_{2f}$ relative to $a_f^*$; $\alpha_2$, $\beta_2$ are constants for weighing $a_f$, $a_{2f}$ relative to $a_{2f}^*$; and K1, K2 are constants for determining the maximum amplitudes of $a_f^*$, $a_{2f}^*$.

6. A method according to claim 5, wherein peak values $P_1$ and $P_2$ of the output characteristic curves of the fundamental wave component $a_f$ and the second harmonic component $a_{2f}$ hold the relation of $$\beta_1/\alpha_1 = \beta_2/\alpha_2 = |P_1|/|P_2|.$$

7. A method according to claim 1, wherein said beam radiating source radiates a light.

8. A method according to claim 7, wherein
    said first mark portion transmits or reflects the light, and
    said beam detector detects the transmitted light in said second mark portion or the reflected light from said mark portion.

9. A method according to claim 8, wherein
    said step for relatively vibrating said second beam and said second member is performed by vibrating a slit plate serving as said second member and having a slit as said second mark portion in the direction perpendicular to the progressing direction of said light.

10. A method according to claim 7, wherein
    said first member is a photoelectric converting mask having the first mark portion for emitting the electron beam due to the light irradiation,
    said second mark portion on said second member consists of material for generating X rays due to the irradiation of the electron beam, and
    said beam detector is an X-ray detector.

11. A method according to claim 10, wherein
    said step for relatively vibrating said second beam and said second member is performed by scanning the electron beam obtained from said first mark portion on said first member in the direction perpendicular to the direction where said first and second members face.

12. A position detecting method for detecting relative positions of a first member and a second member, comprising the steps of:
    radiating a first beam radiated from a beam radiating source onto a first member where a first mark portion is formed, and relatively vibrating said first beam and said first member;
    radiating a second beam obtained from said first mark portion due to said beam reflection onto a second member where a second mark portion is formed;
    detecting by a beam detector, of a beam being obtained from said second member by radiating said second beam onto the second member, and detecting a detection output from said beam detector synchronously with said relative vibration of said first beam and said first member, thereby obtaining a fundamental wave component $a_f$ and an n-th order harmonic component $a_{nf}$ (n is an integer of 2 or more) of said detection output;

performing a function conversion with said fundamental wave component $a_f$ and said n-th order harmonic component used as input signals such that output signals $a_f^*$, $a_{nf}^*$ are free from change in level regardless of change in level of the input signals so as to normalize the input signals $a_f$, $a_{nf}$ and thus, to obtain normalized signals $a_f^*$, $a_{nf}^*$; and detecting the relative positions of said first and second members by use of the signals $a_f^*$ and $a_{nf}^*$ obtained by performing said function conversions.

13. A method according to claim 12, wherein
two synchronous detectors are used to perform said step for obtaining said fundamental wave component $a_f$ and said n-th order harmonic component $a_{nf}$, the first synchronous detector synchronously detects the detection output of said beam detector by use of, as a reference numeral, a signal having the same frequency as an oscillation frequency f of said second beam and said second member, and the second synchronous detector synchronously detects said detection output by use of, as a reference signal, a signal having the frequency which is n times said oscillation frequency f.

14. A method according to claim 13, wherein
the detection output of said beam detector is amplified by a tuning amplifier having the tuning frequency f prior to the synchronous detection by said first synchronous detector, and said detection output is amplified by a tuning amplifier having a tuning frequency nf prior to the synchronous detection by said second synchronous detector.

15. A method according to claim 12, wherein as said step of performing the function conversions,
the conversions are performed to the fundamental wave component $a_f$ and the second harmonic component $a_{2f}$ of the output obtained due to said synchronous detection while the correspondence relation between the peak point of said fundamental wave component $a_f$ and the zero point of said second harmonic component $a_{2f}$ is held.

16. A method according to claim 12, wherein as said function conversions, the conversions represented by the following expressions are performed:

$$\begin{cases} a_f^* = K_1 \dfrac{\alpha_1 a_f}{\alpha_1 |a_f| + \beta_1 |a_{2f}|} \\ a_{2f}^* = K_2 \dfrac{\beta_2 a_{2f}}{\alpha_2 |a_f| + \beta_2 |a_{2f}|} \end{cases}$$

where $\alpha_1$, $\beta_1$, are constants for weighing $a_f$, $a_{2f}$ relative to $a_f^*$; $\alpha_2$, $\beta_2$, are constants for weighing $a_f$, $a_{2f}$ relative to $a_{2f}^*$; and K1, K2 are constants for determining the maximum amplitudes of $a_f^*$, $a_{2f}^*$.

17. A method according to claim 16, wherein paak values $P_1$ and $P_2$ of the output characteristic curves of the fundamental wave component $a_f$ and the second harmonic component $a_{2f}$ hold the relation of $$\beta_1/\alpha_1 = \beta_2/\alpha_2 = |P_1|/|P_2|.$$

18. A method according to claim 14, wherein said beam radiating source radiates a light.

19. A method according to claim 18, wherein
said first mark portion transmits or reflects the light, and said beam detector detects the transmitted light in said second mark portion or the reflected light from said mark portion.

20. A method according to claim 19, wherein
said step for relatively vibrating said first beam and said first member is performed by vibrating a slit plate serving as said first member and having a slit as said first mark portion in the direction perpendicular to the progressing direction of said light.

* * * * *